United States Patent
Betty et al.

(10) Patent No.: US 8,680,818 B2
(45) Date of Patent: Mar. 25, 2014

(54) SENSOR NODE VOLTAGE CLAMPING CIRCUIT AND METHOD

(75) Inventors: Christopher L. Betty, Arlington, TX (US); Paul L. Brohlin, Parker, TX (US); Deepak M. Khanchandani, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 13/269,786

(22) Filed: Oct. 10, 2011

(65) Prior Publication Data
US 2012/0025901 A1 Feb. 2, 2012

Related U.S. Application Data

(62) Division of application No. 12/199,102, filed on Aug. 27, 2008, now Pat. No. 8,111,047.

(51) Int. Cl.
*H02J 7/04* (2006.01)
(52) U.S. Cl.
USPC ............ 320/152; 320/157; 320/160; 320/162
(58) Field of Classification Search
USPC .................. 320/152, 157, 160, 162; 323/366; 361/60
See application file for complete search history.

(56) References Cited

U.S. PATENT DOCUMENTS

| | | | | |
|---|---|---|---|---|
| 5,396,163 | A | * | 3/1995 | Nor et al. ....................... 320/159 |
| 5,563,496 | A | * | 10/1996 | McClure ........................ 320/128 |
| 6,025,698 | A | * | 2/2000 | Kim et al. ...................... 320/132 |
| 6,281,735 | B1 | * | 8/2001 | Page .............................. 327/309 |
| 6,388,495 | B1 | * | 5/2002 | Roy et al. ....................... 327/309 |
| 6,549,877 | B1 | * | 4/2003 | Shekhtman ................... 702/189 |
| 6,897,701 | B2 | * | 5/2005 | Chen et al. ..................... 327/307 |
| 2005/0104560 | A1 | * | 5/2005 | Pai ................................. 320/166 |
| 2005/0116761 | A1 | * | 6/2005 | Pentakota et al. ............. 327/309 |
| 2005/0127918 | A1 | * | 6/2005 | Kutkut et al. .................. 324/430 |
| 2006/0290547 | A1 | * | 12/2006 | Hazucha et al. ............... 341/119 |

* cited by examiner

*Primary Examiner* — Yalkew Fantu
(74) *Attorney, Agent, or Firm* — William B. Kempler; Wade J. Brady, III; Frederick J. Telecky, Jr.

(57) ABSTRACT

A voltage clamping circuit includes a current source having a fixed current source and a variable current source and a variable resistor receiving current from the current source. The variable resistor varies its resistance in response to an environmental operating condition. The voltage clamping circuit also includes an amplifier configured to compare a sensor node voltage with a reference voltage, the sensor node voltage being in communication with the voltage drop across the variable resistor. The amplifier is configured and connected to provide a control output to control the variable current source to modify current output from the variable current source to at least in part prevent the sensor node voltage from exceeding a reference voltage when certain operating conditions are present.

10 Claims, 3 Drawing Sheets

SENSOR NODE VOLTAGE CLAMPING CIRCUIT AND METHOD

CROSS-RELATED APPLICATIONS

This application is a divisional of U.S. Nonprovisional patent application Ser. No. 12/199,102, filed Aug. 27, 2008, which is hereby incorporated by reference in its entirety.

TECHNICAL FIELD OF THE INVENTION

This invention relates generally to clamping circuits and more particularly to clamping circuits used for sensing circuits.

BACKGROUND OF THE INVENTION

Many integrated circuits use thermistors for temperature sensing. For example, many rechargeable batteries include a thermistor in the battery pack, and the chargers use this thermistor to monitor the battery temperature as the battery charges. Control circuitry will disable the battery from charging when the temperature is either too hot or too cold for safe charging of the battery. For many applications, it is desirable to be able to reliably distinguish between the high resistance of a negative temperature coefficient thermistor during a cold condition from the very high or infinite resistance caused by an absent thermistor, which indicates that the battery is removed from the charger.

An example of such a sensor circuit will be described with reference to FIG. 1. The sensor circuit 100 includes a current source 110 that is connected to a variable resistor 120. The variable resistor 120 is of a thermistor type such that the resistance of the variable resistor 120 varies with the temperature of the resistor. Accordingly, the voltage at node 125 will vary with the resistance of the variable resistor 120. Comparators 130 and 140 are in communication with the node 125 to sense the voltage at the node 125. Comparator 130 compares the voltage at node 125 with the reference voltage VR1 and outputs a signal depending on whether the voltage at node 125 is higher than or less than the reference voltage VR1. Similarly, comparator 140 compares the voltage at node 125 with the second reference voltage VR2 and outputs a signal based upon whether the voltage at node 125 is higher than or less than the reference voltage VR2. Based upon the output of the comparators 130 and 140, an additional logic element 150 outputs a signal to the system indicating whether the temperature is too low to charge the battery or whether the battery has been removed from the charger.

An example of the operation of such a system will be described with reference to FIG. 2. In this example, the resistance of the variable resistor 120 is plotted against the temperature of the resistor in graph 200. As the temperature for the variable resistor 120 decreases, the resistance, in turn, increases. Accordingly, as shown in graph 205, the voltage of the node 125 also increases given the constant current applied by the current source 110. When the temperature is warm enough to be safe to charge the battery, the voltage at node 125 is below both of the reference voltages VR1 and VR2 such that neither comparator circuit 130 or 140 outputs a signal indicating a cold or open circuit. As the temperature decreases, approaching the temperature at which it is unsafe to charge the battery, the variable resistor 120 resistance begins to quickly increase thereby increasing the voltage. Eventually, the voltage at node 125 reaches and passes the reference voltage VR1 at which point the comparator 130 provides the signals to the system indicating that the temperature is too low such that the system stops charging the battery. At such low temperatures, the resistance of a typical thermistor increases rapidly in a non-linear fashion; the second reference voltage VR2, however, cannot be set higher than the system voltage VAA. Because of the non-linear relationship between the resistance of the variable resistor 120 and the temperature, the voltage at node 125 quickly exceeds the second reference voltage VR2 with the falling temperature such that comparator 140 provides a signal to the system indicating that the battery has been removed from the charger. Such close proximity between the resistor temperatures at which the node 125 reaches the reference voltages can often lead to erroneous readings that the battery has been removed from the system.

SUMMARY OF THE INVENTION

The above needs are at least partially met through provision of the sensor node voltage clamping surface and method described in the following detailed description, particularly when studied in conjunction with the drawings, wherein:

Generally speaking, pursuant to these various embodiments, a voltage clamping circuit includes a current source having a fixed current source and a variable current source and a variable resistor receiving current from the current source. The variable resistor operates to vary resistance in response to an environmental operating condition for the variable resistor. The voltage clamping circuit also includes an amplifier configured to compare a sensor node voltage with a reference voltage, the sensor node voltage being in communication with the voltage drop across the variable resistor. The amplifier is configured and connected to provide a control output received by the variable current source to modify current output from the variable current source to at least in part prevent the sensor node voltage from crossing a reference voltage. Comparators are configured to compare the sensor node voltage to a first reference voltage and the reference voltage. The amplifier and the variable current source are configured to control the current output from the variable current source to prevent the sensor voltage from exceeding the reference voltage as environmental conditions change.

A method for clamping a sensor node voltage to avoid false signals of an open circuit comprises adjusting a current provided to a variable resistor when the temperature of the variable resistor causes the voltage across the resistor to rise to a given level to lock the voltage drop to the given level. When the variable resistance rises past a certain point, the current provided to the resister loses the ability to lock the voltage drop, and the voltage rises past another threshold which indicates that the circuit is open.

So configured, the voltage clamping circuit clamps the sensor node voltage to a voltage able to indicate that the temperature is too low to charge a battery thereby allowing the circuit to continue to operate while a battery is connected to the system while preventing false signals that the battery has been removed from the system. In other words, such a voltage clamping circuit allows for a device to operate under a low temperature condition for a much larger range of low temperatures before a signal is given that the battery has been removed from the circuit. The larger voltage operation range results in fewer false signals of the battery's being disconnected and can allow a system to operate at lower temperatures because of the lessened risk of false readings.

The above and other features of the present invention will be better understood from the following detailed description of the preferred embodiments of the invention that is provided in connection with the accompanying drawings.

BRIEF DESCRIPTION OF THE DRAWINGS

Further aspects of the invention will appear from the appending claims and from the following detailed description given with reference to the appending drawings.

DETAILED DESCRIPTION OF EXAMPLE EMBODIMENTS

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

Figure 1:
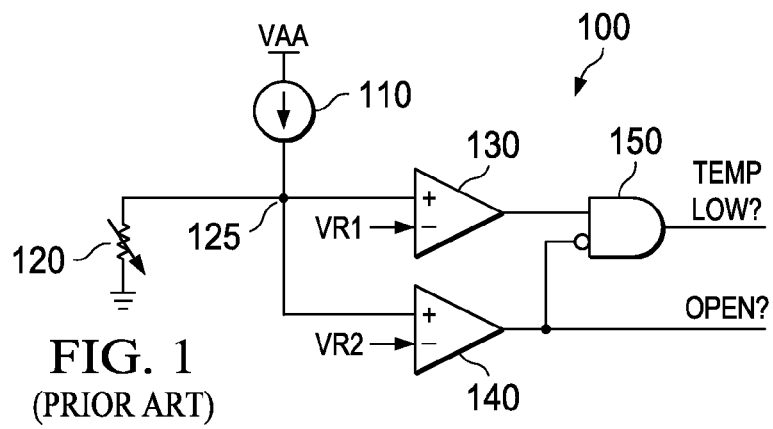
FIG. 1 comprises a circuit diagram of a prior art sensor circuit.
Figure 2:
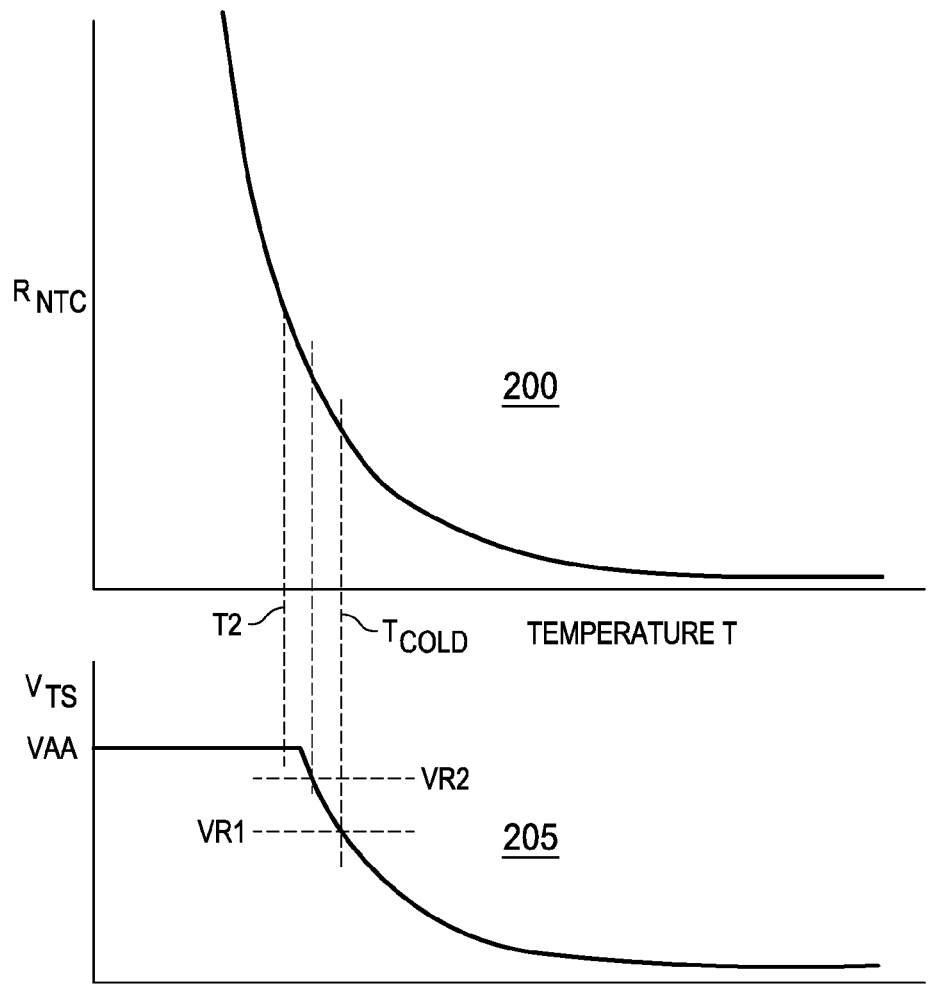
FIG. 2 comprises resistance versus temperature and voltage versus temperature graphs for the circuit of FIG. 1.
Figure 3:
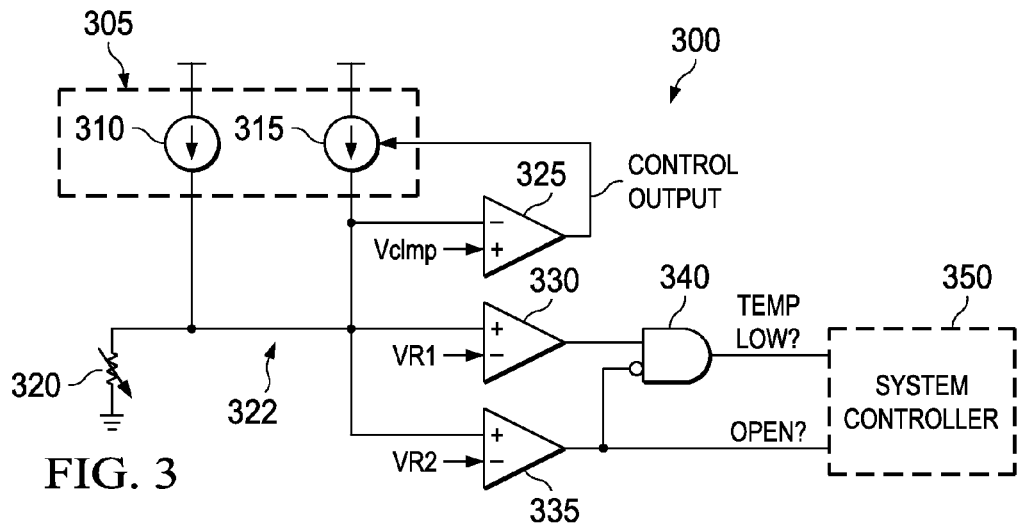
FIG. 3 comprises a circuit diagram of an example voltage clamping circuit as configured in accordance with various embodiments of the invention.

These and other benefits may become clearer upon making a thorough review and study of the detailed description. Referring now to the drawings, and in particular to FIG. 3, an illustrative circuit compatible with many of these teachings will now be presented. The voltage clamping circuit 300 of FIG. 3 includes a current source 305 including a fixed current source 310 and a variable current source 315. A variable resistor 320 receives current from the current source 305. The variable resistor 320 is operable to vary its resistance in response to an environmental operating condition for this variable resistor 320. A common variable resistor of this type is a thermistor or, more specifically, a negative temperature coefficient thermistor that increases its resistance with decreasing temperature. An amplifier 325 is configured to compare a sensor node voltage at sensor node 322 with a clamping voltage, VCLMP, where the sensor node 322 is in communication with a voltage drop across the variable resistor 320. The amplifier 325 is configured and connected to provide a control output to be received by the variable current source 315 in order to modify a current output from the variable current source 315 to at least in part prevent the sensor node 322 voltage from exceeding a high reference voltage.

A first comparator 330 is configured to compare the sensor node 322 voltage to a low reference voltage indicative of the environmental operating condition for the variable resistor. The low reference voltage is typically the voltage expected at the sensor node 322 given the current provided by the current source 305 flowing through the variable resistor 320 when the variable resistor 320 has a temperature at which the battery should no longer be charged. A second comparator 335 is configured to compare the sensor node 322 voltage to the high reference voltage which is indicative of the environmental operating condition for the variable resistor. The high reference voltage is typically set to be close to the voltage that would be present at the sensor node 322 should the variable resistor 320 be removed from the circuit 300.

A digital element 340 is configured to accept a first comparator output from the first comparator 330 and a second comparator output from the second comparator 335. The digital element 340 is configured to accept a first comparator output from the first comparator 330 and a second comparator output from the second comparator 335 and to provide a first output signal when the first comparator output and the second comparator output indicate that the sensor node 322 voltage has predetermined relationships relative to the first reference voltage and the second reference voltage. For example, the digital element 340 is configured to provide a first output signal when the first comparator output indicates that the sensor node 322 voltage is less than the low reference voltage or when the second comparator output indicates that the sensor node 322 voltage is greater than the high reference voltage. In other words, the digital element 340 is configured to allow the system to operate when the sensor node voltage indicates that the temperature is warm enough to allow the system to charge a battery or when the sensor node voltage indicates that the battery is not connected to the system such that the system may continue to operate even though the battery is not longer present.

The digital element can be configured to provide a second output signal when the first comparator output and the second comparator output indicate that the sensor node 322 voltage has a second predetermined relationship relative to the first reference voltage and the second reference voltage. In another example situation, the digital element 340 provides a second output signal when the first comparator output indicates that the sensor node 322 voltage is greater than the low reference voltage and when the second comparator output indicates that the sensor node 322 voltage is less than the high reference voltage. In this situation, the digital element 340 is signaling to the system that the temperature is too low to charge a battery but that the battery is still connected to the system.

The digital element 340, by one approach, is a traditional AND gate circuit with the input connected to the second comparator 335 output inverted. In this approach, the comparators provide digital signals to the AND gate digital element 340 relating to the sensor node 322 voltage. The output of the AND gate, shown below in Table 1, is used by the system to determine the operating state of the battery.

| Input from Comparator 330 | Input from Comparator 335 | Element 340 Output | Operating State |
|---|---|---|---|
| 0 | 0 | 1 | OK to Operate, Warm Enough to Charge |
| 1 | 0 | 0 | Too Cold to Charge |
| 1 | 1 | 1 | OK to Operate, Battery Removed |
| 0 | 1 | 0 | Impossible State |

By one example, the fixed current source 310 provides a current of 0.25 micro amps to the sensor node 322, and the variable current source 315 provides a current of 0.75 micro amps to the sensor node 322. The voltage at the sensor node 322 is determined by the voltage (V) across the variable resistor 320, which is determined by multiplying the total current (I) flowing through the resistance (R) of the variable resistor 320 (in other words, V=I*R). If the low reference voltage VR1 is 2.1 volts and the high reference voltage is 2.75 volts, then when the resistance of the variable resistor is below 2.8 mega ohms, the comparators both output a "0" and the digital element outputs a "1" to the system. The system controller interprets the "1" from the digital element 340 as being OK to operate and the "0" from the second comparator 335 that the battery is connected to the system. If the temperature drops such that the resistance of the variable resistor 320 raises past 2.8 mega ohms, the voltage at the sensor node 322 rises over 2.1 volts. This triggers the comparators 330 and 335 to send the second set of signals (first comparator 330 sends a "1" and the second comparator 335 sends a "0") to the digital element 340. The digital element outputs a "0" that signals to the system to stop operating.

If the resistance of the variable resistor 320 raises past 3.33 mega ohms, the voltage at the sensor node 322 rises over 2.5 volts, a typical level for the clamping voltage VCLMP. At this point, the amplifier 325 begins to reduce the current provided by the variable current source 315 to keep the voltage of the sensor node 322 at 2.5 volts. For instance, if the resistance rises to 4 mega ohms, the amplifier 325 will send a signal to reduce the current from the variable current source 315 to 0.375 micro amps such that the total current from the current source 305 is 0.625 micro amps. If the resistance of the variable resistor 320 rises past 10 mega ohms, the voltage at the sensor node 322 will begin to rise over 2.5 volts because the current from the current source 305 cannot be turned lower than the fixed current source 310, 0.25 micro amps. The voltage at the sensor node 322 will then exceed the high voltage reference value, 2.75 volts, when the resistance at the variable resistor 322 exceeds 11 mega ohms. This triggers the comparators 330 and 335 to send the third set of signals (first comparator 330 sends a "1" and the second comparator 335 sends a "1") to the digital element 340. The digital element outputs a "1" that the system controller interprets as being OK to operate; the system determines that the battery is removed based on the signal from the second comparator 335. The last row of Table 1 is an impossible state because the voltage at the sensor node 322 cannot be below the low reference voltage and above the high reference voltage.

The operation of the voltage clamp circuit 300 will be described further with reference to FIG. 4. When the temperature is warm enough that a battery may be charged by the system, the resistance provided by the variable resistance 320 is relatively low as indicated by graph 405. As the temperature drops, the resistance of the variable resistor 320 rises until the temperature at which point it is unsafe to continue charging the battery. This temperature is indicated at portion 410. The corresponding voltage at sensor node 322 is indicated as low reference voltage VR1 at portion 415 of FIG. 4. As the temperature continues to drop, the voltage at sensor node 322 continues to rise along with the resistance of variable resistor 320. Once the sensor node 322 voltage passes the low reference voltage VR1, the first comparator 330 provides a signal to the digital element 340, which in turn provides a signal to the system to indicate that the system should stop charging the battery.

Figure 4:
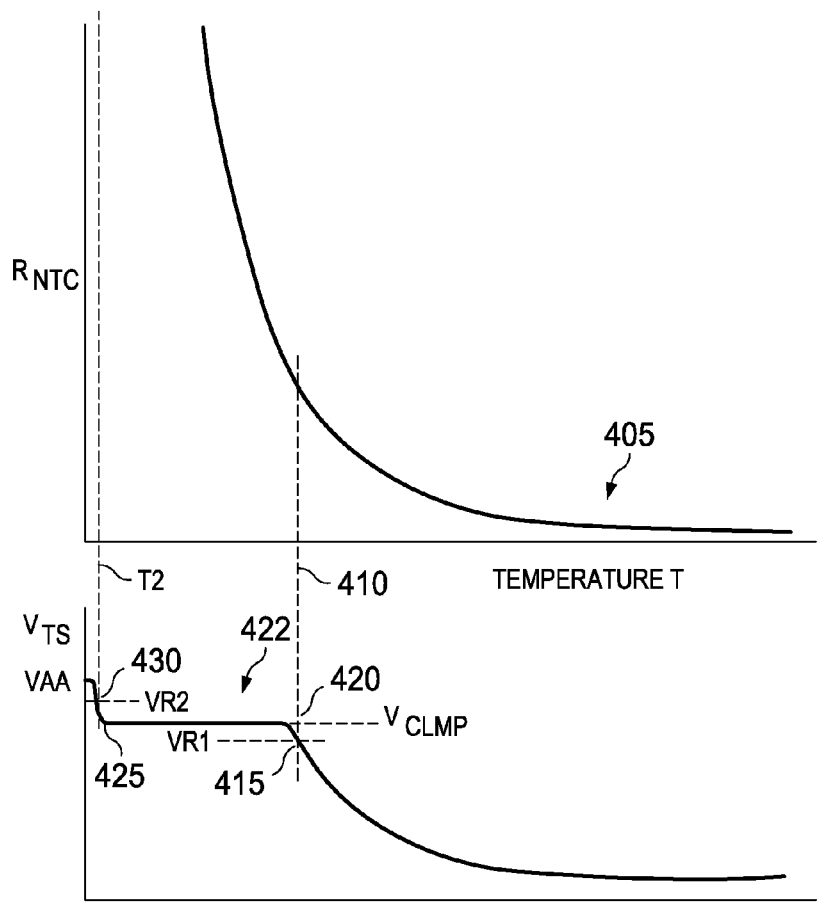
FIG. 4 comprises resistance versus temperature and voltage versus temperature graphs for the example circuit of FIG. 3.

As the temperature continues to drop, the resistance of the variable resistor 320 continues to rise to the point where the voltage at sensor node 322 reaches the clamp voltage VCLMP as shown on the graph in FIG. 4 at portion 420. Once the voltage at sensor node 322 passes a clamp voltage, the amplifier 325 begins to provide a signal that is received by the variable current source 315. This analog signal controls the variable current source 315 to begin to reduce the amount of current provided by the current source 305 to the sensor node 322. The current source 305 is thus controlled by an effective feedback loop from the amplifier 325 to clamp the sensor node 322 voltage to the clamp voltage as shown in FIG. 4 at portion 422. Accordingly, the amplifier 325 and the variable current source 315 are configured to reduce the current output from the variable current source 315 to prevent at least in part the sensor node 322 voltage from exceeding the high reference voltage. As the temperature continues to drop, the resistance of the variable resistor 320 continues to rise. In turn, the amplifier 325 continues to provide a control signal to the variable current source 315 to reduce the current provided by the variable current source 315 in response to the rising sensor node 322 voltage. Eventually, the control signal from the amplifier 325 turns the variable current source 315 completely off such that the current provided by the current source 305 is provided by the fixed current source 310 and cannot drop any further. This point occurs at the voltage level indicated at portion 425 on FIG. 4. At this point, the fixed current source 310 continues providing current after the current output from the variable current source 315 is reduced to approximately zero such that when a resistance at the variable resistor's 320 position in the voltage clamping circuit 300 goes high, the voltage drop across the variable resistor 320 position goes high. Eventually, the voltage at sensor node 322 will pass the high reference voltage VR2 as shown at portion 430 in FIG. 4. The sensor node 322 voltage approaches a system voltage, in this example, VAA, that is higher than the reference voltage when the variable resistor 320 is removed from the voltage clamping circuit 300. At this point, the comparator 335 provides a signal to digital element 340 to indicate that the battery has been removed from the system.

So configured, the voltage at sensor node 322 is effectively clamped to a voltage between the low reference voltage VR1 and the high reference voltage VR2 over a significant range of temperatures for the variable resistor 320. By configuring the fixed current source 310 to provide a small current, the temperature at which the sensor node 322 voltage rises past the clamp voltage is arbitrarily low and configurable for the system. Accordingly, the temperature corresponding to the high reference voltage VR2 can be very low, virtually eliminating any false readings that the battery has been removed. For the sensor node 322 voltage to reach the system voltage VAA, the variable resistor 320 would need to be removed from the circuit 300, thereby forcing the sensor node 322 voltage past the high reference voltage VR2 to signal the missing battery.

Figure 5:
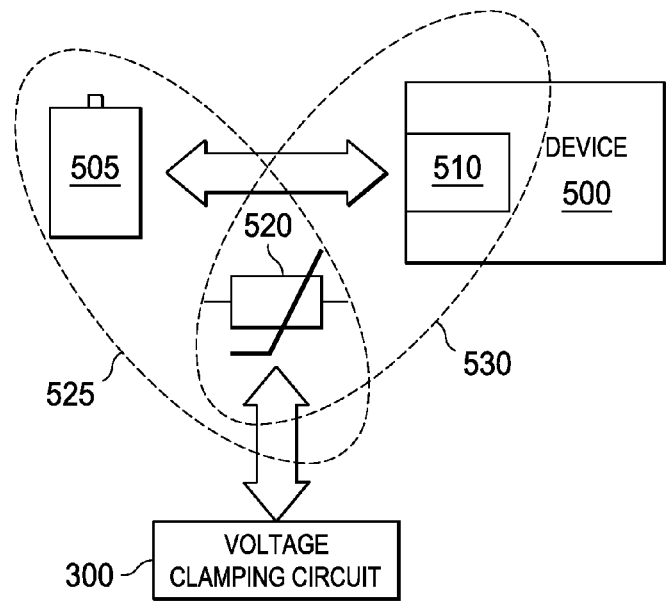
FIG. 5 comprises a block diagram of a system as configured in accordance with various embodiments of the invention.

Example configurations of systems using such voltage clamping circuits will be described with reference to FIG. 5.

The device 500 includes a system for recharging a battery 505 at a port 510 of the device 500. The system includes a thermistor 520 associated with the rechargeable battery 505. The thermistor 520 is operable to vary its resistance in response to the temperature of the rechargeable battery 505. As indicated in FIG. 5, the thermistor 520 may be associated with the battery 505 as indicated by circle 525. In other words, the thermistor 520 may be disposed in the battery or on a package including the battery. In another approach indicated by circle 530, the thermistor 520 may be located in the port 510 or otherwise coupled to the device 500 such that its temperature is indicative of the operating conditions of the device 500. One skilled in the art is able to configure the circuit of FIG. 3 to handle any such approach.

The voltage clamping circuit 300 is an electrical communication with the thermistor 520. The voltage clamping circuit 300 is typically disposed in the device and in electrical communication with the port 510. The thermistor 520 corresponds to the variable resistor 320 at FIG. 3. The voltage clamping circuit 300 includes a current source 305 that has a fixed current source 310 and a variable current source 315. The current source 305 is configured to be in communication with the thermistor 520 when the rechargeable battery 505 is connected to the port 510. The voltage clamping circuit also includes an amplifier 325 configured to compare a sensor node voltage in communication with a voltage drop across the thermistor 520 to a middle reference voltage between a low reference voltage, indicative of the temperature of the rechargeable battery 505, and a high reference voltage indicative of the rechargeable battery 505 being released from the port 510. The amplifier 325 is configured and connected to provide a control output controlling the variable current source 315 to modify a current output from the variable current source, to at least in part prevent the sensor node voltage from exceeding the middle reference voltage when the rechargeable battery 505 is connected to the port 510. The voltage circuit 300 may also include a first comparator, a second comparator, and a digital element as described above with reference to FIG. 3.

Accordingly, the principles of the circuit as shown and described with reference to FIG. 3 may be adaptable to a variety of configurations for the thermistor, battery, and device. For example, the thermistor 520 may be disposed in the device 500 at the port 510 to have a temperature similar to, if not the same as, the battery 505. The voltage clamping circuit can be disposed in the device 500 such that the thermistor 520 acts as the variable resistor 320 as shown in FIG. 3 when the battery 505 is connected to the port 510 regardless of the physical location of the thermistor 520. For any of the configurations, when the battery 505 is removed from the port 510, the equivalent of removing the variable resistor 320 from the circuit of FIG. 3 occurs such that the voltage at the sensor node 322 goes infinite thereby triggering a signal to the system that the battery 505 has been removed.

Figure 6:
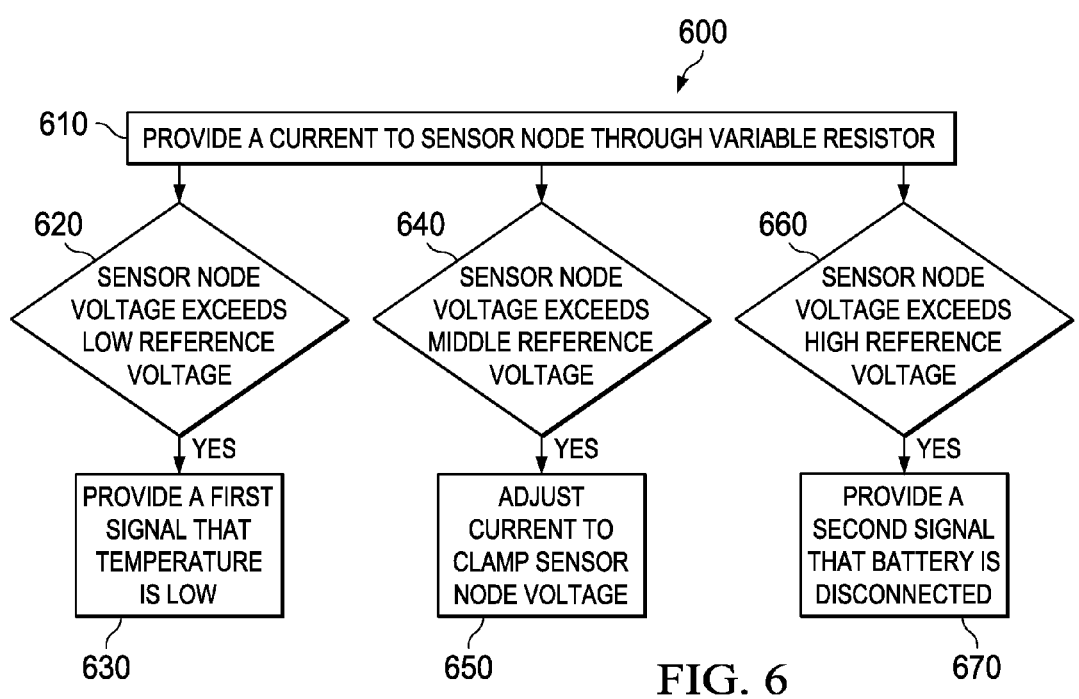
FIG. 6 comprises a flow diagram of a method of operation configured in accordance with various embodiments of the invention.

A method for clamping a sensor node voltage to avoid false signals of an open circuit will be described with reference to FIG. 6. The method 600 includes the step 610 of providing a current to the sensor node such that the current flows through a variable resistor. The voltage is sensed at the sensor node at step 620 to determine whether the sensor node voltage exceeds a low reference voltage. When the sensor node voltage exceeds the low reference voltage, at step 630 a first signal is provided to indicate that the temperature is too low for battery charging. At step 640, the sensor node voltage is sensed to determine whether the sensor node voltage exceeds a middle reference voltage. When the middle reference voltage is exceeded by the sensor node voltage, at step 650 the current provided to the sensor node is adjusted to clamp the sensor node voltage to the middle reference voltage. At step 660, the sensor node voltage is sensed to determine whether the sensor node voltage exceeds a high reference voltage. When the sensor node voltage exceeds the high reference voltage, at step 670 a second signal is provided indicating that the variable resistor has been removed or disconnected from the circuit. If the sensor node voltage does not exceed the low reference voltage, the middle reference voltage, or the high reference voltage, then the system operates normally, for example, to recharge a battery connected to the system. If the sensor node voltage exceeds a low reference voltage, the method may include preventing recharging of the battery.

So configured, the clamping circuit taught by this disclosure provides for a larger margin of error in which to operate at temperatures too low for recharging. By providing this cushion, instances of sensor error indicating that the battery has been removed from the circuit are reduced. A practical result of such a system is the lowering of the minimum temperature at which a system can operate because the temperature cutoff for the battery can be set to lower temperatures if the reference voltage can be reliably separate from the open circuit reference voltage. The system is also configurable to be implemented in a variety of devices. For example, a thermistor that varies resistance with battery temperature may be implemented in the battery or in the device. Similarly, the signal conditions and reference voltages may be configured to fit a particular situation.

Those skilled in the art will recognize that a wide variety of modifications, alterations, and combinations can be made with respect to the above described embodiments without departing from the scope of the invention. For example, the described embodiments refer to high and low reference voltages, but the system may be reversed such that the relative position of the voltages matter and not whether one is "high" or "low." Such modifications, alterations, and combinations are to be viewed as being within the ambit of the inventive concept.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. In a battery charging system, a voltage clamping circuit comprising:
   a current source comprising a fixed current source and a variable current source;
   a variable resistor receiving current from the current source, the variable resistor operable to vary its resistance in response to an environmental operating condition for the variable resistor;
   an amplifier configured to compare a voltage drop across the variable resistor, to a reference voltage, the amplifier configured and connected to provide a control output received by the variable current source to modify a current output from the variable current source to at least in part prevent the voltage drop from crossing a second reference voltage, wherein the fixed current source continues providing current after the current output from the variable current source is reduced to approximately zero such that when a resistance at the variable resistor's position in the voltage clamping circuit goes high, the voltage drop across the variable resistor position goes high.

2. The voltage clamping circuit of claim 1 further comprising:
a first comparator configured to compare the sensor node voltage in communication with the voltage drop across the variable resistor to a first reference voltage indicative of the environmental operating condition for the variable resistor.

3. The voltage clamping circuit of claim 1 further comprising:
a second comparator configured to compare the sensor node voltage in communication with the voltage drop across the variable resistor to the second reference voltage indicative of the environmental operating condition for the variable resistor.

4. The voltage clamping circuit of claim 1 further comprising:
a first comparator configured to compare the sensor node voltage in communication with the voltage drop across the variable resistor to a first reference voltage indicative of the environmental operating condition for the variable resistor;
a second comparator configured to compare the sensor node voltage in communication with the voltage drop across the variable resistor to the second reference voltage indicative of the environmental operating condition for the variable resistor;
a digital element configured to accept a first comparator output from the first comparator and a second comparator output from the second comparator and to provide a first output signal when the first comparator output and the second comparator output indicate that the sensor node voltage has predetermined relationships relative to the first reference voltage and the second reference voltage.

5. The voltage clamping circuit of claim 4 wherein the digital element is configured to provide a second output signal when the first comparator output and the second comparator output indicate that the sensor node voltage has a second predetermined relationship relative to the first reference voltage and the second reference voltage.

6. The voltage clamping circuit of claim 1 wherein the amplifier and the variable current source are configured to reduce the current output from the variable current source to prevent at least in part the sensor voltage from exceeding the second reference voltage.

7. The voltage clamping circuit of claim 1 wherein the sensor node voltage approaches a system voltage that is higher than the reference voltage when the variable resistor is removed from the voltage clamping circuit.

8. A method for clamping a sensor node voltage to avoid false signals of an open circuit comprising:
providing a current to a sensor node such that the current flows through a variable resistor;
sensing the sensor node voltage to determine whether the sensor node voltage exceeds a low reference voltage;
providing a first signal when the sensor node voltage exceeds the low reference voltage;
sensing voltage at the sensor node to determine whether the sensor node voltage exceeds a middle reference voltage;
adjusting the current when the sensor node voltage exceeds the middle reference voltage to clamp the sensor node voltage to the middle reference voltage;
sensing the sensor node voltage to determine whether the sensor node voltage exceeds a high reference voltage;
providing a second signal when the sensor node voltage exceeds the high reference voltage indicating that the variable resistor has been removed.

9. The method of claim 8 further comprising:
recharging a battery when the sensor node voltage is below the low reference voltage;
preventing recharging of a battery when the sensor node voltage is higher than the low reference voltage.

10. A voltage clamping circuit comprising:
a current source comprising a fixed current source and a variable current source;
a variable resistor receiving current from the current source, the variable resistor operable to vary its resistance in response to an environmental operating condition for the variable resistor;
an amplifier configured to compare a sensor node voltage, the sensor node voltage in communication with a voltage drop across the variable resistor, to a reference voltage, the amplifier configured and connected to provide a control output received by the variable current source to modify a current output from the variable current source to at least in part prevent the sensor node voltage from crossing a second reference voltage;
a first comparator configured to compare the sensor node voltage in communication with the voltage drop across the variable resistor to a first reference voltage indicative of the environmental operating condition for the variable resistor;
a second comparator configured to compare the sensor node voltage in communication with the voltage drop across the variable resistor to the second reference voltage indicative of the environmental operating condition for the variable resistor; and
a digital element configured to accept a first comparator output from the first comparator and a second comparator output from the second comparator and to provide a first output signal when the first comparator output and the second comparator output indicate that the sensor node voltage has predetermined relationships relative to the first reference voltage and the second reference voltage.

* * * * *